United States Patent
Gutierrez et al.

(10) Patent No.: US 9,641,103 B2
(45) Date of Patent: May 2, 2017

(54) MEMS DRIVER

(71) Applicant: MEMS DRIVE, INC., Arcadia, CA (US)

(72) Inventors: Roman Gutierrez, Arcadia, CA (US); Hongyu Wang, South Pasadena, CA (US)

(73) Assignee: MEMS Drive, Inc., Arcadia, CA (US)

( * ) Notice: Subject to any disclaimer, the term of this patent is extended or adjusted under 35 U.S.C. 154(b) by 235 days.

(21) Appl. No.: 14/586,307

(22) Filed: Dec. 30, 2014

(65) Prior Publication Data

US 2016/0190958 A1 Jun. 30, 2016

(51) Int. Cl.
H01L 41/04 (2006.01)
H02N 1/00 (2006.01)
B81B 7/00 (2006.01)

(52) U.S. Cl.
CPC ............ H02N 1/008 (2013.01); B81B 7/008 (2013.01)

(58) Field of Classification Search
USPC ........ 318/662, 751, 794, 795, 817, 671, 156
See application file for complete search history.

(56) References Cited

U.S. PATENT DOCUMENTS

| | | | | |
|---|---|---|---|---|
| 4,792,705 A * | 12/1988 | Ouyang | ................. | G05F 3/205 327/376 |
| 5,570,276 A | 10/1996 | Cuk et al. | | |
| 5,998,906 A * | 12/1999 | Jerman | ................. | G02B 6/357 310/309 |
| 2002/0106144 A1* | 8/2002 | Garverick | .......... | G02B 26/0841 385/18 |
| 2002/0113563 A1* | 8/2002 | Jansson | ................. | H02N 2/065 318/116 |
| 2010/0052597 A1* | 3/2010 | Dong | ..................... | H02N 1/008 318/662 |
| 2010/0237929 A1* | 9/2010 | Ikehashi | ................. | H02M 3/07 327/434 |
| 2011/0265559 A1 | 11/2011 | Oh et al. | | |
| 2013/0321379 A1 | 12/2013 | Van Lier et al. | | |
| 2014/0165724 A1 | 6/2014 | Krylov et al. | | |
| 2014/0266093 A1* | 9/2014 | Isham | .................. | H02M 3/158 323/271 |

OTHER PUBLICATIONS

Patent Cooperation Treaty, International Search Report for PCT/US2015/055819, Mar. 11, 2016, pp. 1-4.

* cited by examiner

*Primary Examiner* — Bentsu Ro
*Assistant Examiner* — Iftekhar Mustafa
(74) *Attorney, Agent, or Firm* — Brian J. Colandreo; Michael T. Abramson; Holland & Knight 1LP

(57) ABSTRACT

Systems and methods provide actuator control. Actuator control is provided via charge control as opposed to voltage control. A driver for driving an actuator can include a charge pump for injecting charge into one or more capacitive elements of the actuator. The driver can further include a capacitance detection aspect for detecting the capacitance of the capacitive elements of the actuator to determine positioning of the actuator.

18 Claims, 14 Drawing Sheets

MEMS DRIVER

TECHNICAL FIELD

The present disclosure relates generally to electro-mechanical devices and systems, such as microelectromechanical systems (MEMS). More particularly, various embodiments of the technology disclosed herein are directed to the use of MEMS drivers controlled via charge.

BACKGROUND

MEMS electrostatic actuators or transducers have a myriad of uses ranging from accelerometers to gyroscopes, to pressure sensors, microphones, etc. MEMS generally include components or elements that can be less than 1 μm to several millimeters, where at least some of the elements have some sort of mechanical functionality or aspect to them. For example, MEMS-based motion sensors for digital cameras has been developed to address the image degradation that results from human hand tremor or other blur-inducing actions, e.g., MEMS-based gyroscopes may be used to sense camera motion. In response to the sensed motion, an optical image stabilization (OIS) system attempts to move the lens or the image sensor to minimize or eliminate the resulting motion-induced blurring of the image, which can also be accomplished using MEMS-based actuators.

One example of a MEMS-based actuator relies on the use of a comb drive having at least two comb structures in an opposing orientation like interlocking teeth. Attractive electrostatic forces may be generated when a voltage is applied to the comb drive causing the comb structures to be drawn together, where those forces are proportional to the change in capacitance between the comb structures. Hence, such devices are traditionally voltage-controlled devices. Moreover, operation of comb drives can be based on the granularity or resolution provided, e.g., by a digital-to-analog converter (DAC). DACs are generally used to drive such devices because the associated electrostatic forces are non-linear, and so appropriate digital values must be used to provide an appropriate amount of voltage to drive the devices.

SUMMARY

Systems and methods are provided in various embodiments for controlling a MEMS actuator via charge. In accordance with one embodiment of the technology disclosed herein, a driver device comprises a charge pump to generate voltage required to inject charge into an actuator. The driver device further comprises a charge sink through which the actuator can be discharged, wherein the charging and discharging of the actuator effectuates movement of the actuator. Further still, the driver device comprises a switch for operatively connecting the charge pump and the charge sink to the actuator.

In accordance with another embodiment of the technology disclosed herein, a driver device comprises a driver circuit for driving a MEMS actuator via charge control to induce voltage that results in desired movement of the MEMS actuator while allowing the voltage to vary. The driver circuit comprises a charge pump configured to inject charge into the MEMS actuator, a charge sink configured to sink charge from the MEMS actuator, and a switch configured to switch at least one of the charge pump and the charge sink to an appropriate capacitive element of the MEMS actuator.

In accordance with still another embodiment of the technology disclosed herein, a method comprises successively charging and discharging an actuator to effectuate movement of the actuator. The method further comprises determining a capacitance of the actuator to determine a position of the actuator resulting from the movement of the actuator by sensing voltage at an input of the actuator.

Other features and aspects of the disclosure will become apparent from the following detailed description, taken in conjunction with the accompanying drawings, which illustrate, by way of example, the features in accordance with various embodiments. The summary is not intended to limit the scope of the invention, which is defined solely by the claims attached hereto.

BRIEF DESCRIPTION OF THE DRAWINGS

The technology disclosed herein, in accordance with one or more various embodiments, is described in detail with reference to the following figures. The drawings are provided for purposes of illustration only and merely depict typical or example embodiments of the disclosed technology. These drawings are provided to facilitate the reader's understanding of the disclosed technology and shall not be considered limiting of the breadth, scope, or applicability thereof. It should be noted that for clarity and ease of illustration these drawings are not necessarily made to scale.

DETAILED DESCRIPTION

Figure 1A:
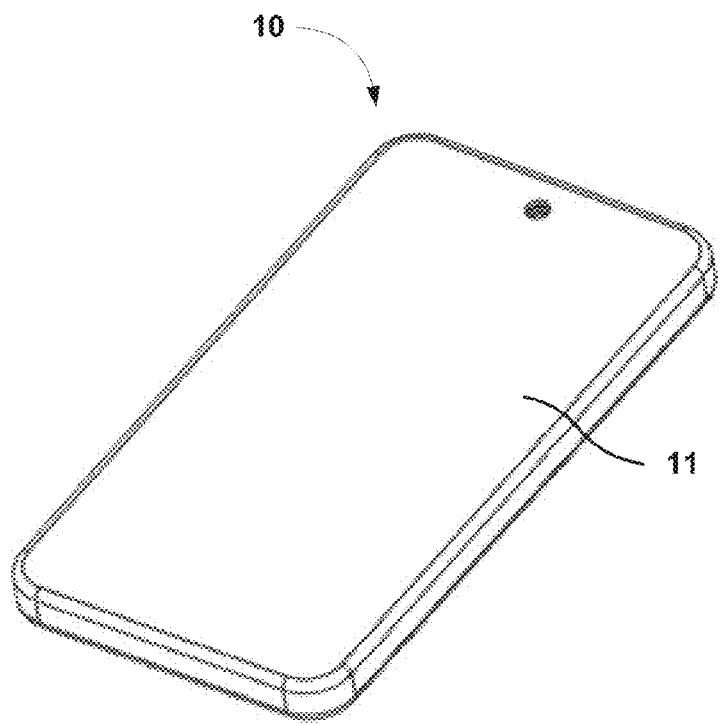
FIG. 1A is a perspective view of an example mobile device in which various embodiments of the technology disclosed herein may be implemented.

An actuator device may include one or more MEMS actuators or other electrostatic devices/mechanisms, and may be suitable for use in a wide variety of different electronic devices. For example, an actuator device can be adapted for use in a camera, such as a miniature camera, for example, to either manually or automatically focus the miniature camera, zoom the miniature camera, or to provide OIS for the miniature camera. Additionally still, an actuator device may be used to align the optics within the miniature camera, or for any other desired application in an electronic device in which an actuator device may be utilized.

An actuator device may be formed using monolithic or non-monolithic construction. An actuator device may be formed using contemporary fabrication techniques, such as etching and micromachining, for example. Various other fabrication techniques are also contemplated. An actuator device may be formed of silicon (e.g., single crystal silicon and/or polycrystalline silicon), or other semiconductors such as silicon, germanium, diamond, and gallium arsenide. The material with which the actuator device is formed may be doped to obtain a desired conductivity thereof. Alternatively still, an actuator device may be formed of a metal such as tungsten, titanium, germanium, aluminum, or nickel, or some desired combination thereof. An actuator may be made of an organic material such as plastic, photoresist, or epoxy, filled or coated with conductive materials to obtain a desired conductivity.

Motion control of an actuator device and/or items moved by the actuator device may be used to facilitate a desired movement of an item while mitigating undesired movement of the item. For example, the motion control may be used to facilitate movement of a lens along an optical axis of the lens, while inhibiting other movements of the lens. Thus, the motion control may be used to facilitate movement of the lens in single desired translational degree of freedom while inhibiting movement of the lens in all other translational degrees of freedom and while inhibiting movement of the lens in all rotational degrees of freedom. In another example, the motion control may facilitate movement of the lens in all three translational degrees of freedom while inhibiting movement of the lens in all rotational degrees of freedom.

Thus, an enhanced miniature camera for standalone use and for use in electronic devices may be provided. The miniature camera is suitable for use in a wide variety of different electronic devices. For example, the miniature camera is suitable for use in electronic devices such as cellular telephones, laptop computers, televisions, handheld devices, and surveillance devices. However, and again, various embodiments can be applied to and implemented in a myriad of MEMS devices and contexts.

As previously described, conventional systems and methods of controlling movement in an actuator device rely on voltage control to drive the one or more MEMS actuators. That is, a desired voltage can be applied to a MEMS actuator, such as a comb drive (an example of a capacitive actuator) to induce movement by utilizing electrostatic forces that act between two electrically conductive combs. The attractive electrostatic forces are created when a voltage is applied between the static and moving combs causing them to be drawn together. The force developed by the actuator is proportional to the change in capacitance between the two combs, increasing with driving voltage, the number of comb teeth and the gap between the teeth. That is, the more voltage is applied, the more movement can be induced. However, such systems have a nonlinear response, and high voltage systems (e.g., requiring 30V, 45V, or even greater voltage), where the position of a comb drive is proportional to the square of the drive voltage, $V^2$, (because force is proportional to the square of voltage) require a large number of bits to achieve the required resolution when attempting to control movement. Furthermore, instability of comb drive actuators is a significant design limitation when desired operating voltage exceeds what is known as the snap-in voltage (snap-in referring an instability phenomenon whereby, e.g., a moving comb can snap sideways in a static comb). Finally, voltage control of an electrostatic actuator results in what is known as electrostatic spring softening, which reduces the stiffness of the actuator.

Accordingly, various embodiments are directed to systems and methods for controlling a MEMS actuator using charge control rather than attempting to control the drive voltage (conventional wisdom characterizing electrostatic devices such as capacitors as voltage-dependent or variable devices as opposed to, e.g., resistors, which are considered as current or charge-dependent devices). It should be understood that the capacitance (C) of a capacitor is equal to the electric charge (Q) stored on the capacitor divided by voltage (V). Mathematically, spring force (associated with a flexure of a comb drive) is equal to the compression distance multiplied by stiffness factor, and the spring force (absent other forces such as gravity) is equivalent to the electrostatic force. Accordingly, the position of a MEMS actuator is proportional to $V^2$ as described above, or to $Q^{2/3}$, where it can be appreciated that position has a more linear dependence on charge, $Q^{2/3}$. As a result, the required resolution is much smaller and more easily achieved when controlling charge rather than voltage.

Moreover, stability can be improved in comb drive design as well as its motion control system. In particular, constraints regarding flexure stiffness requirements can be relaxed, or maximum voltage can be increased (while still avoiding snap-in) when controlling charge rather than voltage. In a comb drive where fingers are horizontally positioned, the mechanical equilibrium position without any applied electric field is at: $x=0$; $y=\Delta$, where $\Delta$ is representative of finger offset. Comb drive fingers may have an initial overlap, 1, and a balanced gap (i.e., the zero finger offset case), g, where the fingers have a uniform width. This system can be represented as a parallel plate capacitance model, where finger deformation is negligible. The aforementioned motion control system can be thought of as two independent springs moving in the x and y directions. When comparing driving with charge rather than voltage, a voltage-driven comb drive and a charge-driven comb drive have the same stiffness ratio requirement for stability purposes if the fingers remain at a center position, i.e., $\alpha=0$. Once the fingers go off center, the voltage-driven comb drive stiffness ratio requirement increases much faster than that of the charge-driven comb drive case for both small and large finger offset scenarios. Accordingly, and again, driving a MEMS actuator with charge provides significant advantages over driving with voltage.

Further regarding spring stiffness, charge control of an electrostatic actuator, in stark contrast with the electrostatic spring softening of voltage control, results in electrostatic spring stiffening. This effect can be advantageously used since a structure can be designed having a lower stiffness that requires less force to move, while still behaving as though it has a higher stiffness, e.g., lower gravitational sag and a higher resonant frequency. That is, and when charge control is used on an electrostatic actuator (such as a comb drive), the voltage increases when the capacitance decreases (i.e., the comb drive disengaging) and decreases when the capacitance increases (i.e., the comb drive engaging). Accordingly, the electrostatic actuator has an electrostatic force that maintains it in its stable position. This adds to the spring force that maintains it in position when voltage is held constant. Again, this electrostatic force is essentially a spring force, and can be referred to as an electrostatic spring stiffening force. The electrostatic spring constant is equal to twice the mechanical (or actual physical) spring constant, assuming that the comb drive has zero overlap, x=0, when charge is equal to zero, Q=0.

Further still, control of an actuator via charge can be simpler than implementing voltage control, where an actuator controlled with charge acts similarly to a stepper motor, where each charge bundle that is injected leads to a movement increment. For example, in an OIS control system, a gyroscope is used to sense a rotation rate (theta dot). The desired capacitance rate (C dot of t) based on desired movement of the image sensor is determined to compensate the rotation rate measured by the gyroscope. The error in capacitance (position) is measured by measuring capacitance and subtracting the desired capacitance. The time to wait before providing the next charge pulse can be calculated by taking into account a desired change in capacitance, the error in capacitance, and the desired capacitance rate. When the capacitance needs to be increased, a charge command can be sent. When the capacitance needs to be decreased, a discharge command can be sent.

Thus, a MEMS actuator can be controlled by injecting charge. When a voltage is applied to a capacitor, it is in effect, being charged. However, instead of attempting to precisely control the voltage to achieve the desired affect by incorporating voltage feedback and relying an analog-to-digital converter to set voltage (e.g., applying a drive voltage of 1/10 of a mV and still inducing too much movement), the voltage is no longer considered. Rather, charge can be added to a voltage-based device, such as a MEMS actuator to induce a voltage which results in movement of the MEMS actuator.

Figure 1B:
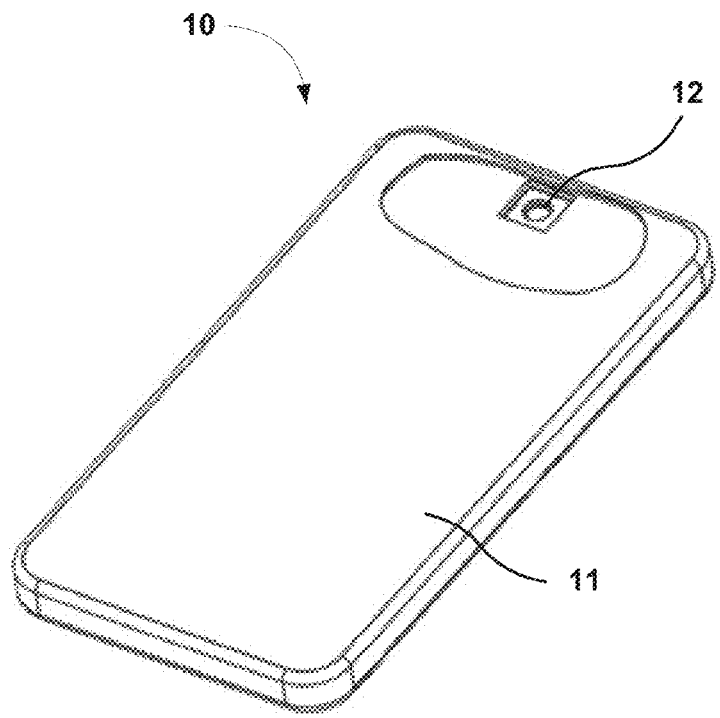
FIG. 1B is a breakout perspective view of the example mobile device of FIG. 1A.

FIG. 1A illustrates a perspective view of an example mobile device 11, which can be a mobile phone, that contains a miniature camera 12 in which various embodiments may be implemented. Miniature camera 12 may employ an image sensor package, such as a moving image sensor package. Miniature camera 12 may achieve various functionality related to image sensor movement, such as OIS, automatic focusing (AF), alignment between lens and image sensor, and the like. FIG. 1B illustrates mobile device 10 of FIG. 1A with the housing/enclosure partially exposed to reveal miniature camera 12 in accordance with one embodiment of technology disclosed herein. It should be noted that although various embodiments disclosed herein are presented in the context of miniature camera modules for use in mobile devices, such as mobile phones, tablet personal computers (PCs), laptop PCs, and the like, the disclosed technology can be adapted for use in other devices or contexts involving the driving of MEMS devices.

As alluded to previously, various embodiments of the technology disclosed herein can employ OIS functionality, such as three axis OIS that is operative or can compensate for camera movement involving roll, pitch, and yaw by moving an image sensor. Accordingly, a device, such as camera 12, may include a lens barrel, an autofocus (AF) actuator, and a moving image sensor package. The AF actuator may be a voice coil motor (VCM) type of actuator, a MEMS actuator, a piezoelectric actuator, a shape memory alloy actuator, or any other type of actuator.

Figure 2:
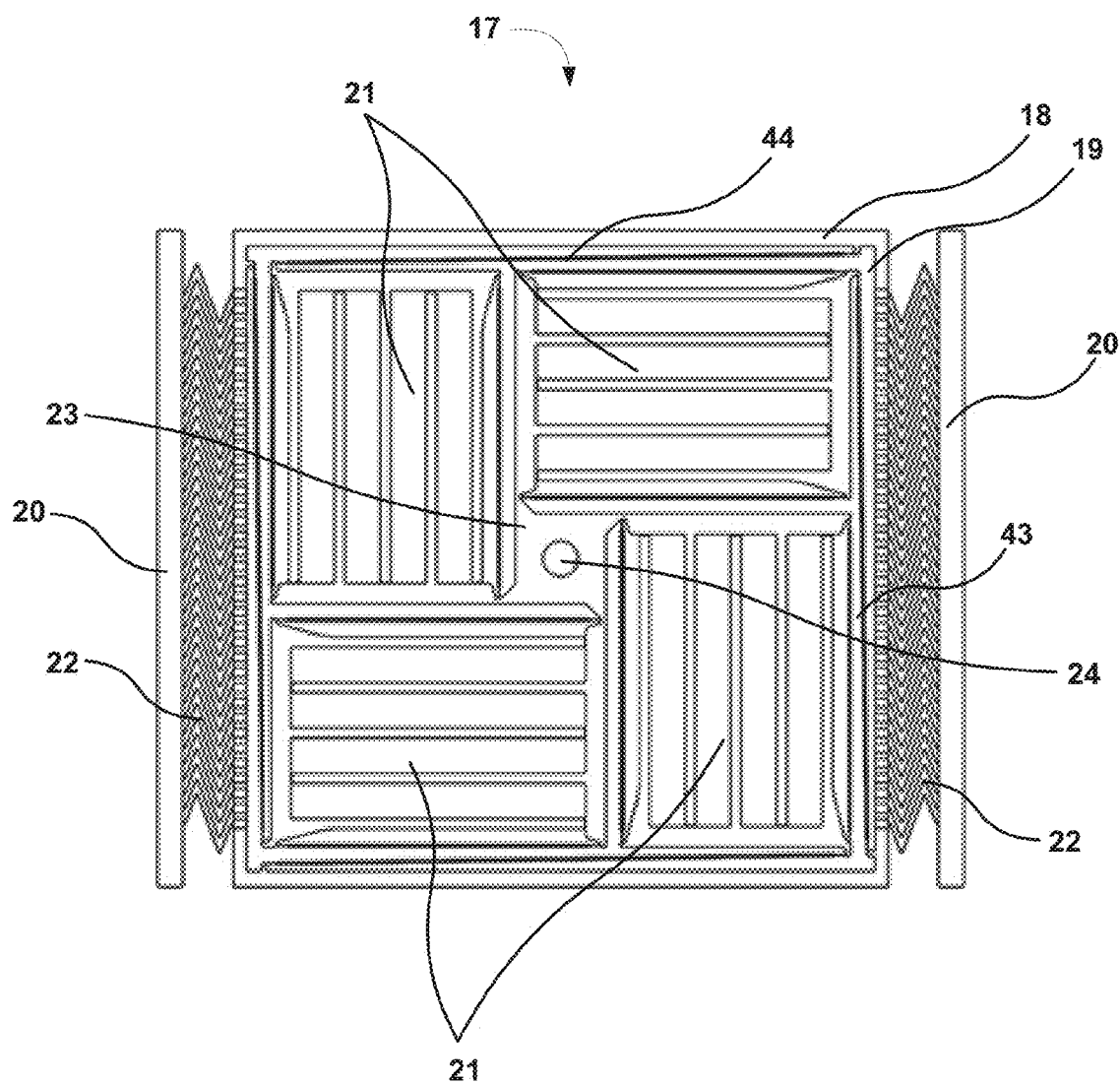
FIG. 2 is a top view of an example MEMS actuator utilized in accordance with various embodiments of the technology disclosed herein.

FIG. 2 illustrates a top planar view of an example MEMS actuator 17 that can be utilized to implement the aforementioned OIS functionality in accordance with various embodiments of the technology disclosed herein. MEMS actuator 17 can be used to move the image sensor inside the moving image sensor package in accordance with "three degrees of freedom" in order to enable OIS. Some examples of MEMS actuators suitable for moving an image sensor are described in U.S. Application Ser. No. 61/975,617 which is incorporated herein by reference in its entirety.

In one embodiment, MEMS actuator 17 can include a middle frame 18 with contact pads 19, an outer frame separated into two electrical bars 20, four actuation areas 21, a central anchor 23 with a glue hole 24, and a plurality of electrical connection flexures 22. The number of glue holes 24 is not limited to one, as there may be multiple holes depending on the relevant electrical connection requirements. The glue hole 24 may have multiple purposes including, e.g., enabling a structural bond to mount MEMS actuator 17 to a carrier substrate by applying thermal epoxy, as well as enabling an electrical connection from MEMS actuator 17 to a conductive trace or substrate by applying conductive epoxy, solder, metal pastes, or other electrical connection methods. The outer electrical bars 20 can provide connections between the MEMS actuator 17 and the rest of the moving image sensor package. Contact pads 19 on middle frame 18 can provide electrical connections between the image sensor (not shown) and MEMS actuator 17.

Each actuation area 21 may contain electrostatic comb drives that provide motive force in one linear direction. The four actuation areas 21 together provide movement in the X and Y directions, and rotation about the Z axis. MEMS actuator 17 can therefore move in two linear degrees of freedom and one rotational degree of freedom to achieve OIS of a miniature camera in all three rotational degrees of freedom. The actuation areas 21 are connected to the central anchor 23 through parallel motion control flexures 43 and to the middle frame 18 through connection flexures 44 that are stiff in the motion degree of freedom and soft in other degrees of freedom. In one embodiment, actuation areas 21 includes features that limit mechanical movement during drop or shock to reduce the stress on the parallel motion control flexures 43 and the connection flexures 44. In one embodiment, the image sensor is attached to the outer frame 20 and the central anchor 23, while the middle frame 18 is attached to the rest of the moving image sensor package.

It should be noted that the X/Y dimensions of MEMS actuator 17 are related to the moving image sensor package size. In one embodiment, the outline dimensions of the middle frame 18 substantially match the size of the image sensor. In another embodiment, the outline dimensions of the outer frame 20 substantially match the size of the image sensor. In still another embodiment, the thickness of the MEMS actuator 17 is approximately 150 micrometers and the in-plane dimensions are approximately 8 mm in the X dimension and 6 mm in the Y dimension.

Figure 3:
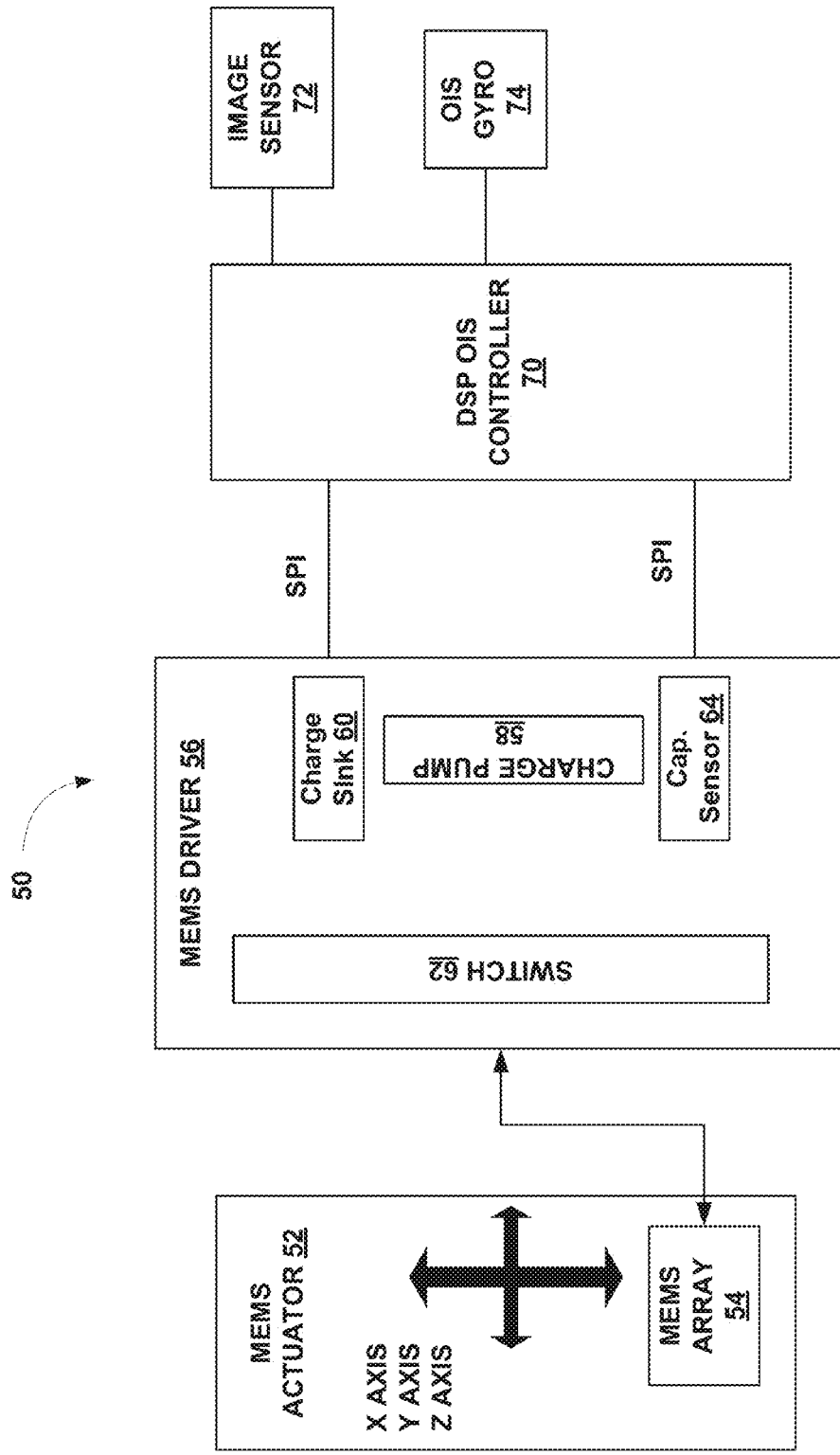
FIG. 3 is a schematic representation of an example camera module including a charge controlled MEMS driver in accordance with one embodiment of the technology disclosed herein.

FIG. 3 illustrates an example camera module 50 which may include some or all of the aforementioned elements of a moving image sensor. Included in camera module 50 are a digital signal processing (DSP) OIS controller 70 for controlling the OIS functionality, an image sensor 72, and an OIS gyroscope 74 for detecting movement, such as roll, pitch, and yaw. Also included in camera module 50 are a MEMS actuator 52 including one or more MEMS arrays 54, and a MEMS driver 56. MEMS driver 56 can control movement of MEMS actuator 52, by injecting charge into MEMS actuator 52 and, in some embodiments, receiving positional feedback from MEMS actuator 52. In one embodiment, the DSP OIS controller 70 and the MEMS driver 56 are integrated together into a single mixed signal integrated circuit (IC).

MEMS driver 56 can drive MEMS actuator 52 by the injection of charge commensurate with control signaling from DSP OIS controller 70. MEMS driver 56 operates by increasing or decreasing the voltage outputs (by charging a charge pump 58 (charge capacitor) and discharging a charge sink 60 (discharge capacitor), as will be described in greater detail below. MEMS driver 56 can be, as illustrated in this embodiment, a mixed signal integrated circuit (IC) or chip. That is, MEMS driver 56 may have both a high voltage portion for driving high voltage devices, e.g., MEMS actuator 52, and a digital signal/low voltage portion (e.g., a serial parallel interface (SPI) interface). In accordance with another embodiment, such as that which will be described below, a high voltage controller is implemented separately.

Accordingly, MEMS driver 56 can be configured as a high voltage driver while also providing capacitance sensing. That is, capacitance sensing module 64 can sense the MEMS actuator 52, which can be one or more capacitive comb drive elements, to determine the size of the capacitance and therefore, the position of MEMS actuator 52, which can then be communicated to DSP OIS controller 70.

In particular, high voltage (e.g., 45V) is provided to drive MEMS actuator 52 through the use of charge pump 58 for injecting charge, which also interfaces with DSP OIS controller 70 via an SPI (or in other embodiments, a I2C bus). Charge control analog circuitry such as that described herein can be used in such a mixed signal IC that uses SPI in place of a parallel digital interface to reduce pin requirements. Accordingly, charge-driven devices are suitable for digital control and allow for a reduction in the complexity of the resulting electronics. Switch 62 can switch the charge pump 58 and charge sink 60 circuitry to the appropriate device. Through the same connections used to inject and sink charge, capacitance sensing can be accomplished by detecting the appropriate capacitance of MEMS actuator 52 and communicating this information via SPI or I2C to DSP OIS Controller 70. Capacitance sensing may be done by a variety of methods, including but not limited to sensing the amplitude and phase of an AC signal (varying voltage) fed through the MEMS capacitor; charging or discharging the MEMS capacitor and looking at the time it takes to charge or discharge; or charging and discharging the MEMS capacitor and looking at the slope of the voltage with a differentiator. Moreover, DSP OIS controller 70 can communicate with image sensor 72 and OIS gyroscope 74, e.g., via digital interfaces.

Figure 4:
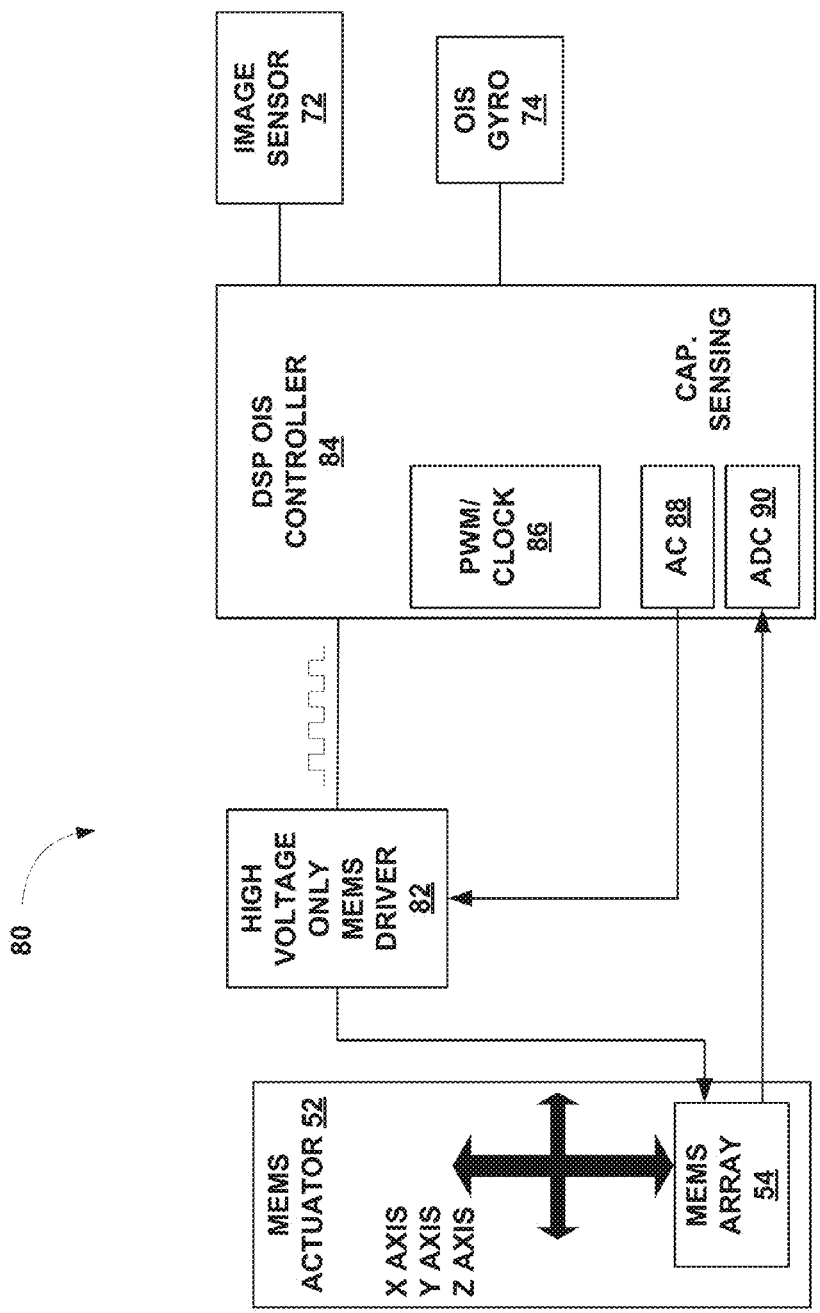
FIG. 4 is a schematic representation of an example camera module including a charge controlled MEMS driver in accordance with another embodiment of the technology disclosed herein.

FIG. 4 illustrates an example camera module 80 which may include some or all of the aforementioned elements of a moving image sensor. Included in camera module 80 are a DSP OIS controller 84 for controlling the OIS functionality, an image sensor 72, and an OIS gyroscope 74 for detecting movement, such as roll, pitch, and yaw. Also included in camera module 80 are a MEMS actuator 52 including one or more MEMS arrays 54, which can be one embodiment of MEMS actuator 17 of FIG. 2, and a MEMS driver 82, which may be a high voltage only MEMS driver. That is, MEMS driver 82 need only include high voltage only driver circuitry without any low power circuitry or digital blocks.

MEMS driver 82 can control movement of MEMS actuator 52 by injecting charge into and sinking charge out of the MEMS actuator 52. MEMS driver 82 can drive MEMS actuator 52 by the injection of charge commensurate with a clock pulse via pulse width modulation (PWM) and clock module 86 of DSP OIS controller 84. The PWM aspect of PWM and clock module 86 operates to interface (parallel digital interface) with MEMS driver 82 to increase or decrease the voltage outputs by charging from a high voltage generated by a charge pump or other circuit that generates a high voltage, e.g., 45V or greater, and discharging to a charge sink, as will be described in greater detail below.

Capacitance sensing is performed in DSP OIS Controller 82, separately from MEMS driver 84, where an AC signal can be sent (via AC module 88) to a portion of MEMS driver 82 (described in greater detail below) and on to MEMS actuator 52, which can be one or more capacitive comb drive elements) to sense coupling to determine the size of the capacitance and therefore, the position of MEMS actuator 52. It should be noted that although the figure shows that the ADC 90 and the AC generator 88 work together to sense the capacitance of the MEMS actuator 52, many other methods of capacitance sensing may be used using a combination of the low voltage DSP OIS controller 84 and the high voltage MEMS driver 82. For example, capacitance sensing may be done by a variety of methods, including but not limited to sensing the amplitude and phase of an AC signal fed through the MEMS capacitor; charging or discharging the MEMS capacitor and looking at the time it takes to charge or discharge; or charging and discharging the MEMS capacitor and looking at the slope of the voltage with a differentiator.

Figure 5:
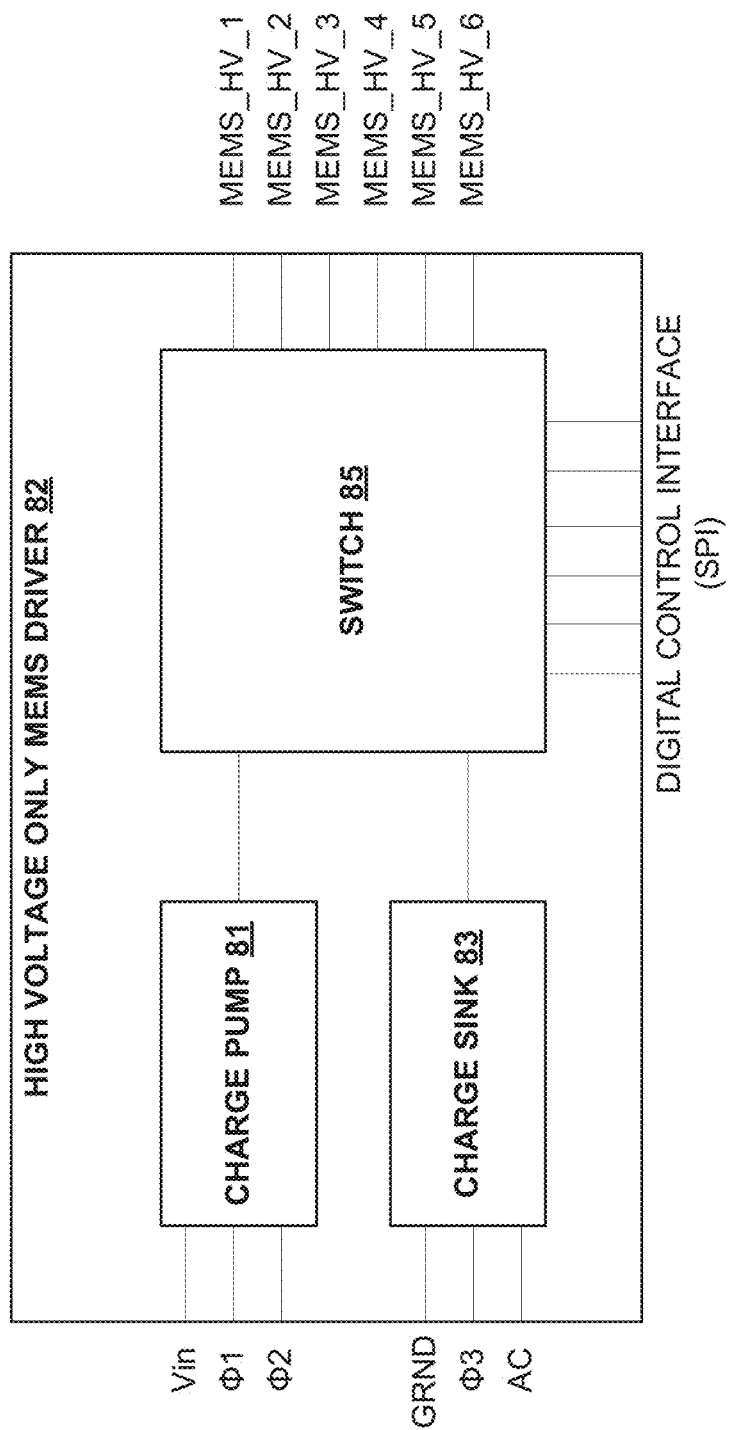
FIG. 5 is a schematic representation of an example high voltage only driver of the charge controlled MEMS driver of FIG. 4.
Figure 6:
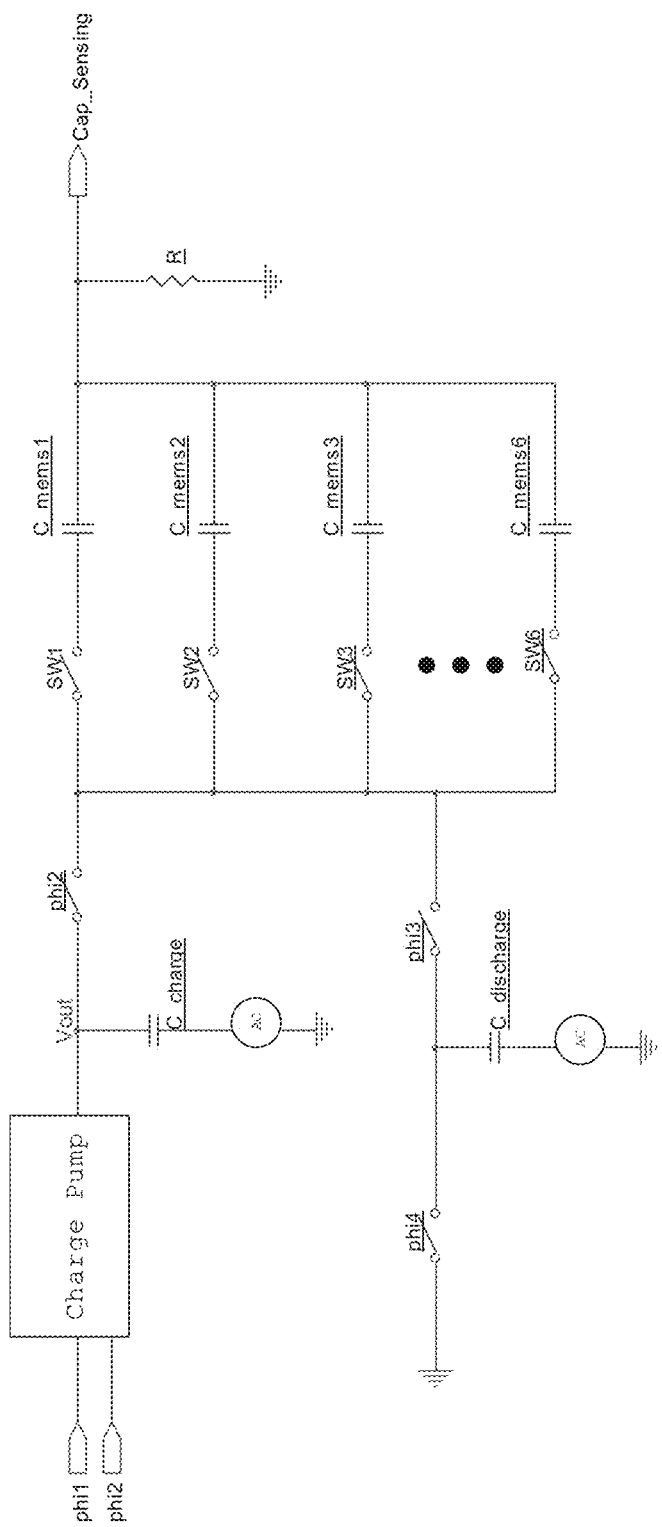
FIG. 6 is an example circuit diagram of the high voltage only driver of FIG. 5.

FIG. 5 is a schematic representation of high voltage only MEMS driver 82, which includes a charge pump 81, a charge sink 83, and a switch 85. Charge pump 81 receives clock signals $\Phi 1$ and $\Phi 2$ as well as an input voltage Vin that can be multiplied to a desired amount resulting in an output voltage Vout, e.g., 45V. FIG. 6 illustrates an example circuit diagram of MEMS driver 82 of FIG. 5 further illustrating the connectivity of charge pump 81 to switch 85 and on to, in this example 6 outputs to 6 MEMS actuators (C_mems1, C_mems2, C_mems3, . . . C_mems6). A charging capacitor, C_charge, can be approximately 1 pF to achieve an approximate 0.5 μm displacement resolution. A discharging capacitor, C_discharge, can also be approximately 1 pF to achieve an approximate 0.5 μm displacement resolution. The AC signal used for capacitance sensing may be a sine wave having a frequency of 10 KHz, for example, where the capacitance sensing has a resolution of 12 bits. The ADC speed can be, e.g., 100 KHz, where the higher the ADC speed, the better. The smaller the charge/discharge capacitance is, there is a higher displacement resolution that can be achieved, although there may be a tradeoff with capacitance sensing accuracy. For example, with a 10 KHz AC signal, a 100 kHz 12-bit ADC, and a 1 pF charge/discharge capacitor, achieving 1 pF capacitance sensing accuracy might involve injecting AC from a different path (e.g., separate cap sensing from charge and discharge). Further regarding capacitance sensing, it should be noted that in order to achieve accurate capacitance measurement, the AC sine wave preferably has a very stable amplitude and frequency, where amplitude error is smaller than 0.1%. Moreover, the AC sine wave frequency (as well as the frequency of charging/discharging) can be programmable or optimized to avoid hitting any mechanical resonance frequency of the MEMS actuator. The clock for PWM can be approximately 48 MHz.

Figure 7:
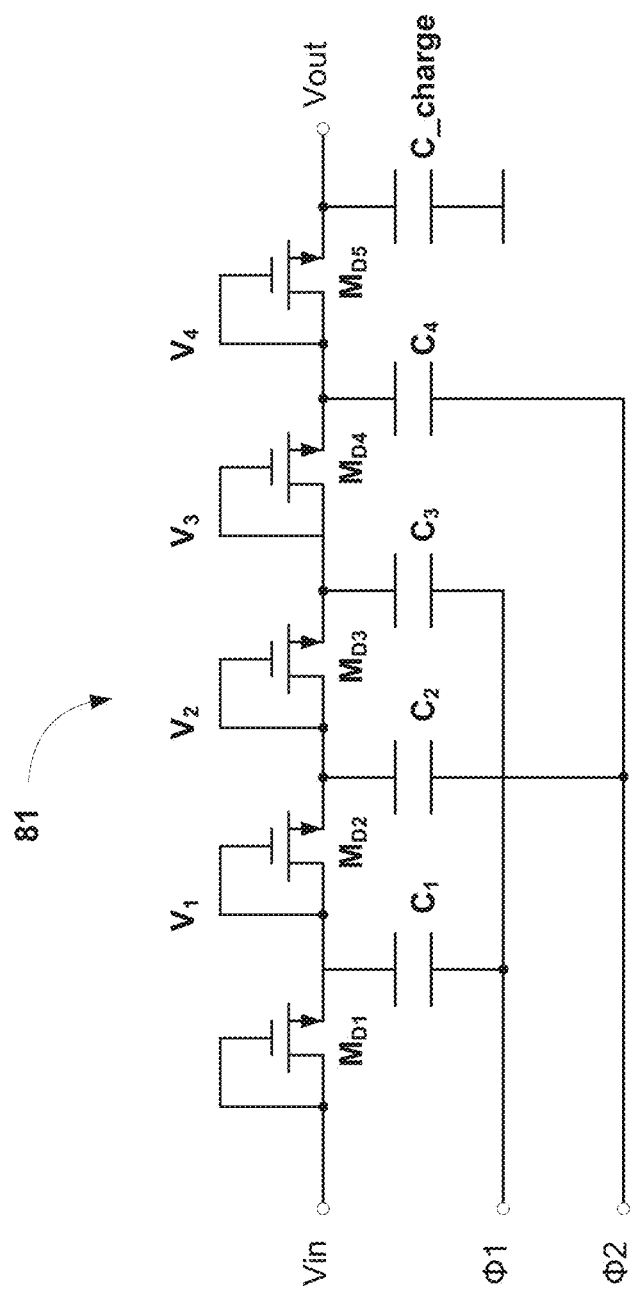
FIG. 7 is a circuit diagram of an example charge pump utilized in the high voltage only driver of FIG. 5.

FIG. 7 illustrates one simple example of charge pump, in this case, a 4-stage (×5) Dickson charge pump with diode-wired metal-oxide semiconductor FETs (MOSFETs) $M_{D1}$-$M_{D5}$ to pump up Vin in stages (V1 to V2 to V3 to V4), with the last capacitor, C_charge, in the chain setting the amount of charge injection that will ultimately be sent to MEMS actuator 52. Other more advanced charge pump designs exist in the art to reach the desired Vout, e.g. 45 V or greater. As described above, the charge injected into MEMS actuator 52 is controlled in accordance with various embodiments rather than attempting to control the voltage applied to MEMS actuator 52. It should be noted that current control can be added to charge pump 81.

Figure 8:
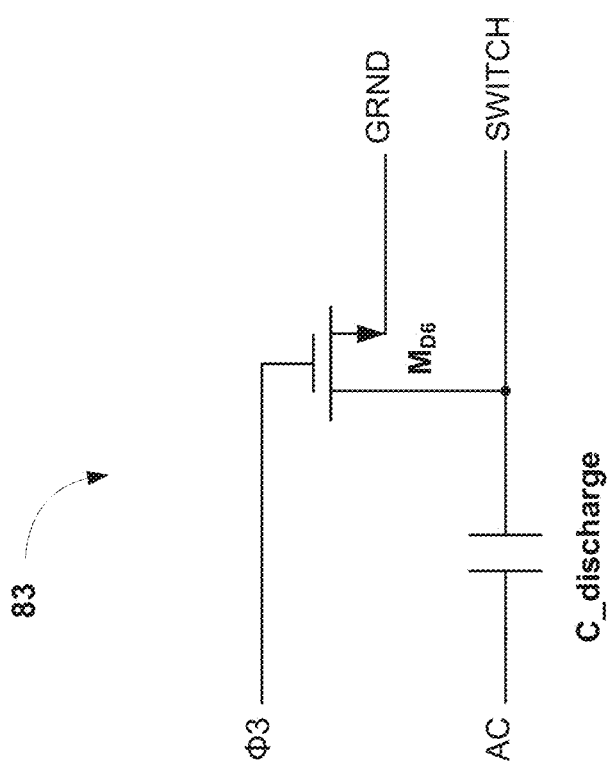
FIG. 8 is a circuit diagram of an example charge sink utilized in the high voltage only driver of FIG. 5.

Charge sink 83 of FIG. 5, and illustrated in greater detail in FIG. 8, sets the amount of charge that is sunk. Charge sink 83 receives a clock signal Φ3 and when switched to connect to MEMS actuator 54, discharges MEMS actuator 54. In particular, a FET, $M_{D6}$ may be used to empty a single capacitor charge. It should be noted that the discharge capacitor, C_discharge, of charge sink 83 sets the resolution of the amount of charge to discharge from MEMS actuator 54. In terms of capacitance sensing, an AC signal can be provided during charging and discharging cycles, where a MEMS ground is connected to a digital chip to sense the AC signal that passes through to MEMS actuator 54. It should be noted that current control can be added to charge pump 81 and charge sink 83 (as will be described in greater detail below).

Figure 9:
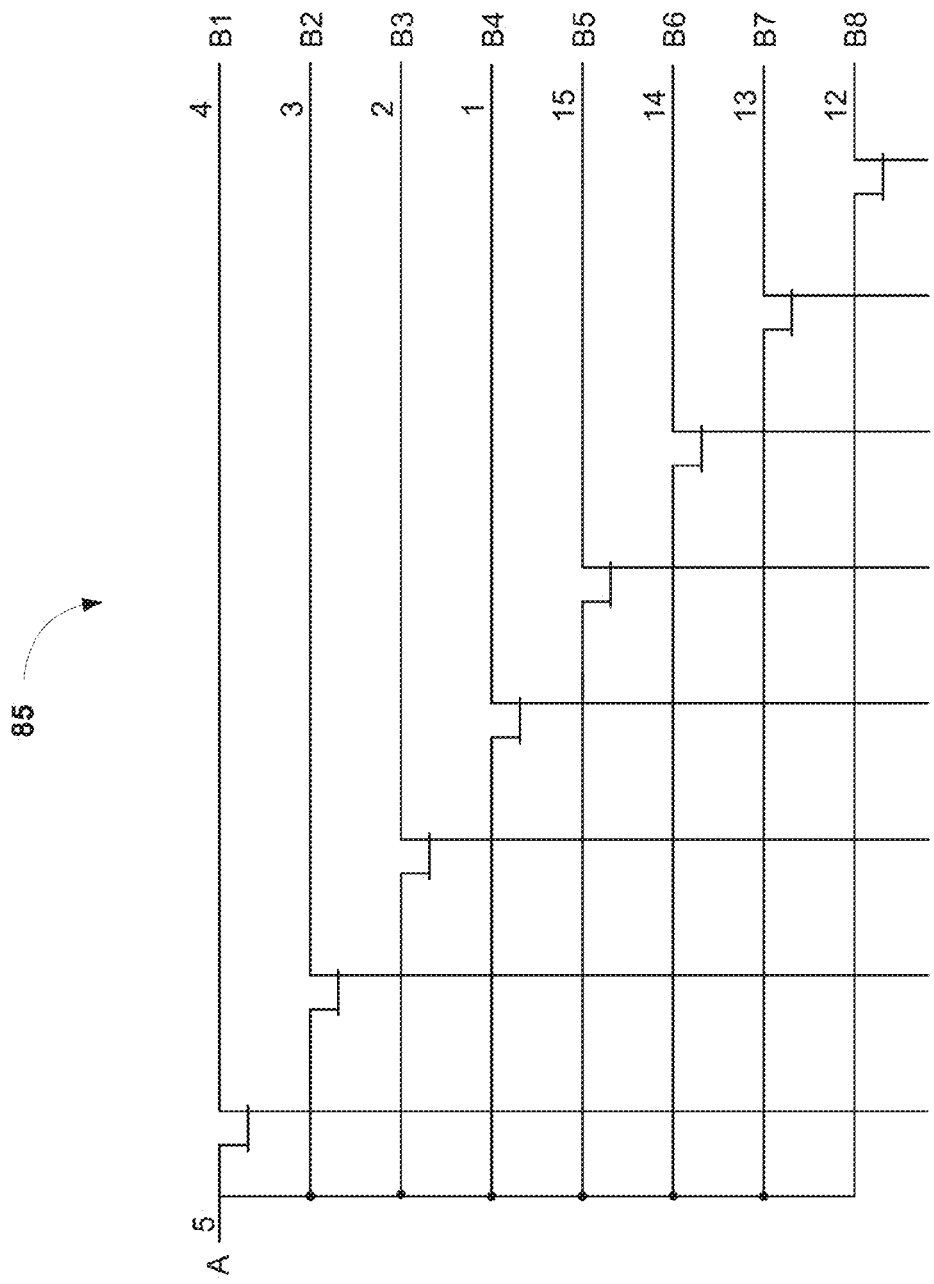
FIG. 9 is a circuit diagram of an example switch utilized in the high voltage only driver of FIG. 5.

Charge sink 83 and charge pump 81 work in conjunction, where during a clock pulse or signal, the capacitor C_charge of charge pump 81 is charged and the capacitor C_discharge of charge sink 83 is discharged. For MEMS actuator 54, which again, is or can be considered to be a capacitive element(s), if more charge is desired to effect a desired amount of movement, switch 85 (which can be a FET array as illustrated in FIG. 9) can be flipped to connect charge pump 81 (in particular, the capacitor C_charge) to MEMS actuator 54. MEMS actuator 54 and charge pump 81 capacitor will then equalize in charge until both have the same voltage. If disengagement of the combs is desired, switch 85 can be flipped to connect MEMS actuator 54 to charge sink 83 (in particular, capacitor C_discharge) such that the charge in MEMS actuator 54 will dissipate until charge sink 83 and MEMS actuator 54 equalize to the same voltage. This process can be constantly repeated in accordance with the clock pulse which be, e.g., a 1 MHz, 10 MHz, 100 MHz, etc. clock pulse, where charging and discharging can happen simultaneously. The constant charging and discharging of charge pump 81 and charge sink 83 assures the last capacitor of charge pump 81 is always completely charged, and the capacitor of charge sink 83 is always completely discharged. It should be noted that the respective capacitances of charge pump 81 and charge sink 83 relative to that of MEMS actuator 54 is as small as possible to obtain optimal resolution.

As alluded to above, an AC signal can be injected into charge sink 83 to measure the capacitance of MEMS actuator 54 by monitoring how much of the AC signal makes it through to MEMS actuator 54.

Figure 10:
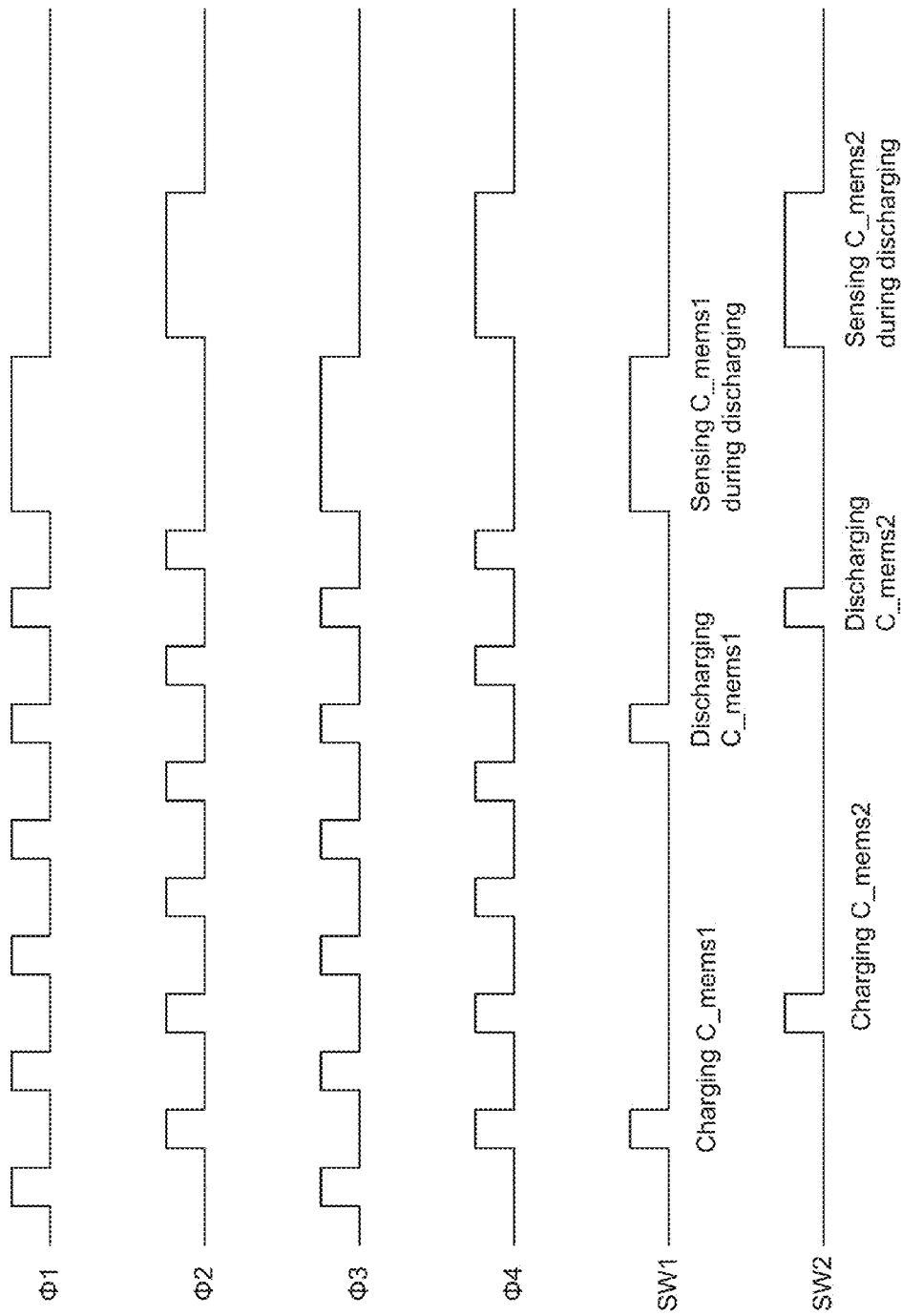
FIG. 10 illustrates example timing waveforms utilized in various embodiments of the technology disclosed herein.

FIG. 10 illustrates timing waveforms for controlling the above-described circuits in accordance with various embodiments. As illustrated in FIG. 10, when Φ2 is high, one of the MEMS actuators can be charged through the charge pump capacitor (C_charge in FIG. 6, for example) by turning on its switch (phi 2 switch in FIG. 6). When Φ3 is high, one the MEMS actuators can be discharged through the charge sink capacitor (C_discharge) by turning on its respective switch (phi 3 switch in FIG. 6). It should be noted that the timing waveforms are such that Φ2 and Φ3 are not high at the same time, and Φ1=Φ3, and Φ2=Φ4. The clock signal Φ4 and its corresponding switch phi 4 allow for grounding the discharge capacitor after it has been charged by connection to the MEMS capacitor through phi 3. Capacitance can be sensed during charging or discharging, wherein when capacitance is being determined, the particular MEMS actuator that is being sensed is in a connected state, i.e., so that the amount of the AC signal that makes it through to that MEMS actuator can be determined.

Figure 11:
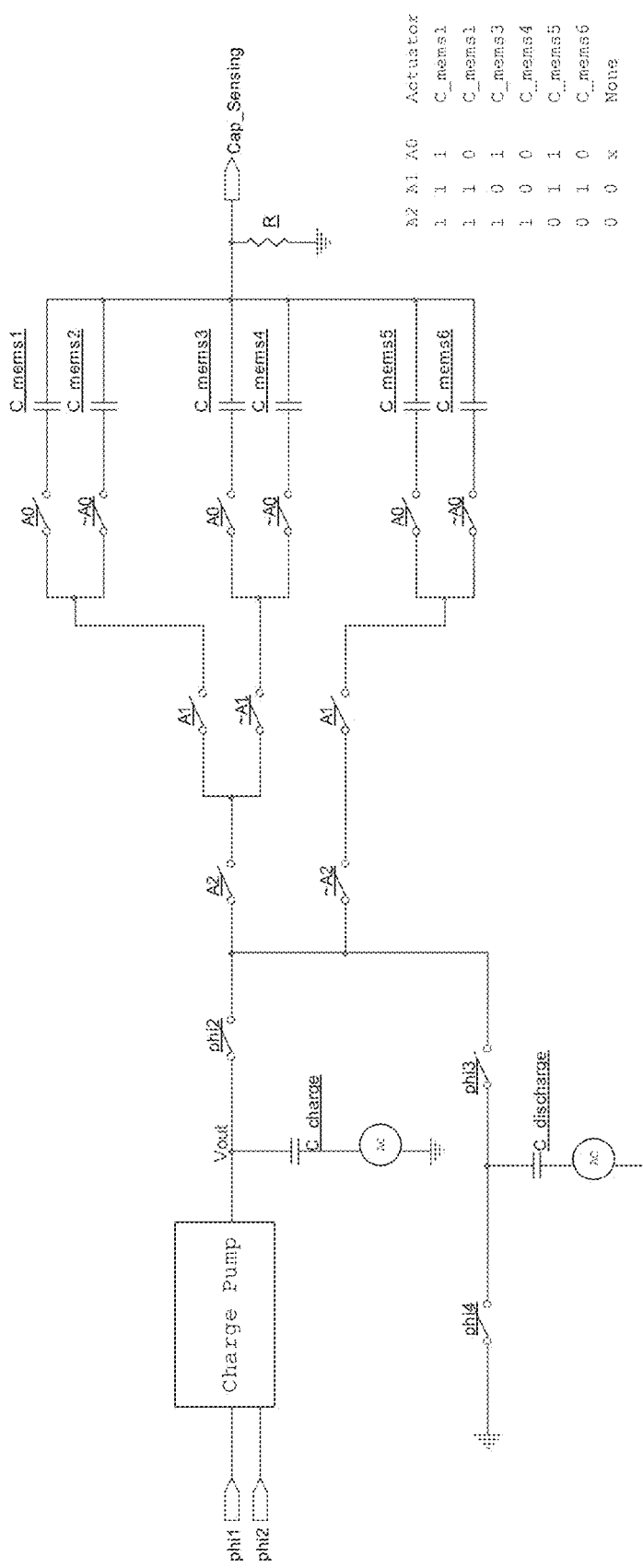
FIG. 11 is a circuit diagram of an alternative embodiment of the high voltage only driver of FIG. 5.

In the aforementioned examples and figures, e.g., FIG. 6, the example circuit diagram is that of circuit having ten interface ports (including six switches, each switch controlling the charging and discharging of one MEMS actuator/capacitor). FIG. 11 illustrates an alternative circuit diagram in which the number of interface ports can be reduced, e.g. to seven. The number of control ports for the switches can be reduced to three instead of six by encoding them into a binary format. For example, 111 turns on SW1, 110 turns on SW2, etc. It should be noted that inverters would be utilized in the high voltage driver chip. As previously described, it is also possible to incorporate digital circuits to convert the parallel digital interface into a serial interface (e.g. SPI or I2C) to further reduce pin requirements.

Figure 12:
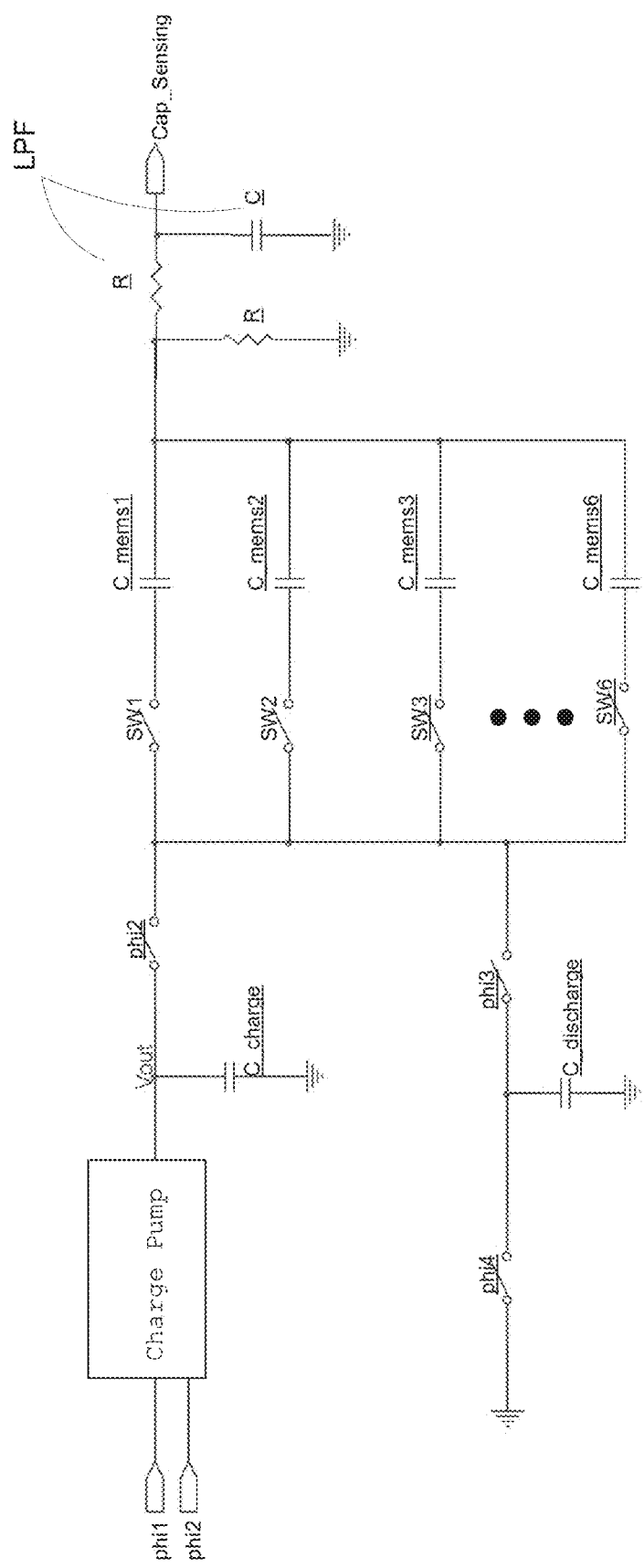
FIG. 12 is a circuit diagram of another alternative embodiment of the high voltage only driver of FIG. 5.

FIG. 12 illustrates an alternative circuit for sensing capacitance in accordance with another embodiment. In particular, capacitance sensing in this example involves switching between charging (i.e., Φ2) and discharging (i.e., Φ3) the MEMS capacitor. The current being drawn in and out of the MEMS capacitor turns into a voltage by the resistor connected to ground on the output of the MEMS capacitor. A low pass filter (LPF) can be implemented on the output to integrate this voltage and create a low voltage signal that can be read by low voltage electronics to determine capacitance of a connected MEMS actuator. That is, the peak-to-peak voltage can be measured to determine capacitance if switching between charging and discharging. The waveform can then be digitized when using multiple charge and discharge pulses in series.

Figure 13:
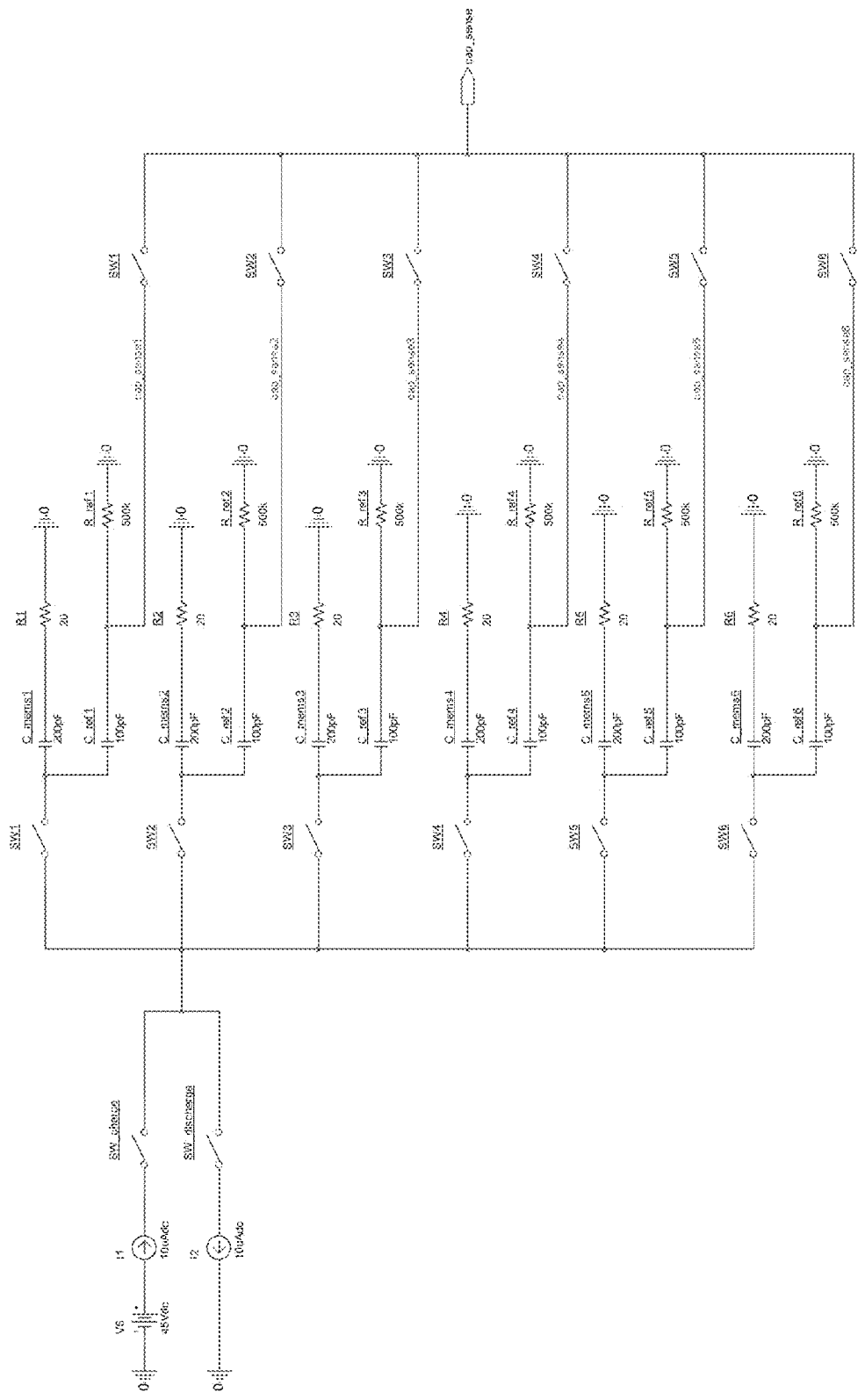
FIG. 13 is a circuit diagram of still another alternative embodiment of the high voltage only driver of FIG. 5.

FIG. 13 illustrates still other alternative circuitry, where successive charging and discharging of the MEMS capacitor creates a linear ramp up and ramp down of voltage. The slope of this triangle voltage ramp, which is a function of the MEMS capacitance, is measured with a differentiator circuit and an analog to digital converter. Alternatively, the time it takes to change output voltage can be measured using, for example, a comparator and a counter. A current source I1 element and a current sink I2 element can be used to replace the charging and discharging capacitors (C_charge and C_discharge of FIGS. 6, 11, and 12). Current source I1 may be an e.g., approximately 10 µA current source, and current sink may be an, e.g., approximately −10 µA current sink. Again, FET array switches can be utilized to connect the charge and discharge circuits to the MEMS capacitors. In this case, the amount of time that a MEMS capacitor is connected to the current source or current sink, as controlled by the length of a PWM control pulse, determines the amount of charge that is injected or removed from the MEMS capacitor.

Capacitance sensing RC circuits can be provided, one for each of the MEMS capacitors, where the capacitance sensing outputs (cap_sense1-6) are all sent to a single output port using, e.g., FET switches or by multiplexing. In particular, an appropriate switch (SW1-SW6) can be used to connect to an appropriate/selected MEMS actuator (C_mems1-C_mems6), and the charge switch SW_charge can be switched on for some charge time, T_charge (e.g., 250 μs). Subsequently, the charge switch SW_charge can be turned off, and the discharge switch, SW_discharge, can be turned on for some discharge time, T_discharge (e.g., 250 μs). The voltage across the relevant reference resistor R_ref1-R_ref6 can be measured. During a charge period, the voltage on the reference resistor will stabilize at R_ref*I_source*C_ref/(Cmems+C_ref). The time constant for charge/discharge is R_ref*C_ref*Cmems/(C_ref+C_mems). Accordingly, capacitance of a MEMS actuator can be derived from the measurement of the stabilized voltage of the reference resistor. For example, to measure the capacitance of a MEMS actuator in FIG. 13, where each of Cmems1-C_mems6 can range from approximately 200 pf to 500 pf (including parasitic capacitance) at 1 pf precision, the resolution needed is 1.3 mV. Thus, an 11-bit 2V ADC is sufficient. Capacitance of a MEMS actuator can also be obtained by measuring the time constant. To get 1 pf precision at full range, an approximately 72 MHz system clock would be utilized. As yet another alternative, the capacitance of a MEMS actuator can be determined by sampling voltages without waiting until the voltage is stabilized and then fitting the data to determine either the charging time constant or extrapolating the stabilized voltage.

It should be noted that in the context of OIS, to compensate for handshake at, e.g., 20 Hz, full travel for three actuators within 25 ms may be required. Following the above example, the time constant would be approximately 50 μs. If charging an actuator for 0.25 ms and discharging for 0.25 ms, approximately 0.5 ms would be needed in order to measure the capacitance a single time (although this measurement time could be shortened based on fine-tuning certain parameters). In order to drive an actuator, the T_charge can be lengthened or shortened relative to the T_discharge for some desired time period, where measuring the capacitance of the actuator includes driving the actuator as well. To obtain a level of precision of, e.g., 0.5 μm, control of T_charge and T_discharge would require a 0.25 μs resolution. As it should be understood by someone skilled in the art, many modifications of this circuit are possible, including reducing the resistance and capacitance of the differentiator and increasing the current to measure capacitance at a faster rate, and replacing the passive RC differentiator with an active circuit.

Figure 14:
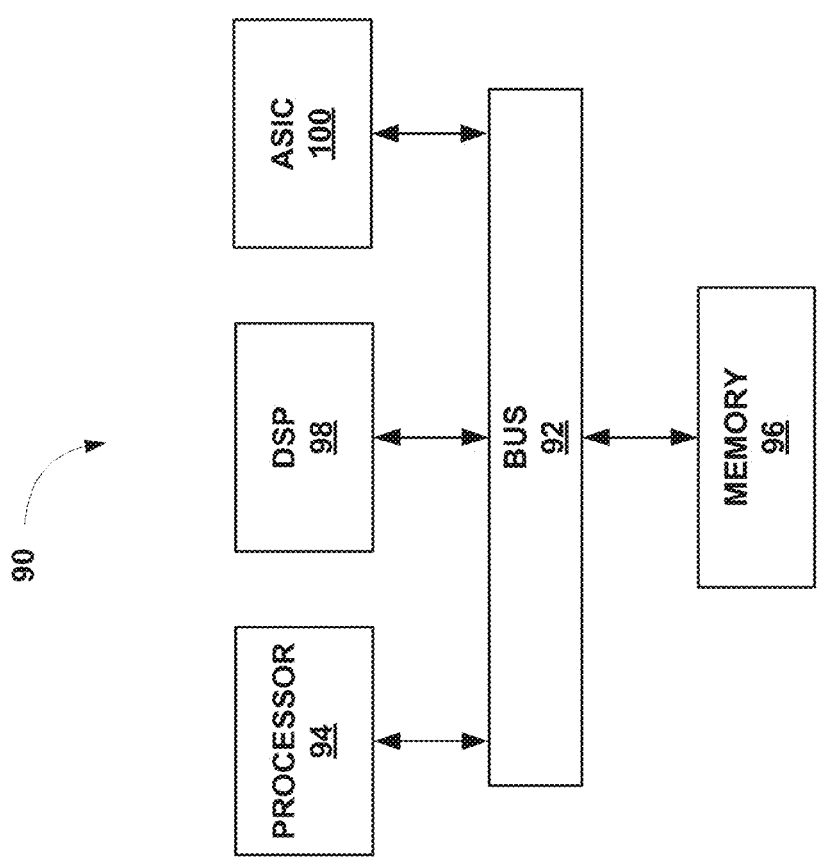
FIG. 14 illustrates an example chip set that can be utilized in implementing architectures and methods for controlling a MEMS driver using charge in accordance with various embodiments of the technology disclosed herein.

FIG. 14 illustrates a chip set/computing module 90 in which embodiments of the technology disclosed herein may be implemented. Chip set 90 can include, for instance, processor, memory, and additional image components incorporated in one or more physical packages. By way of example, a physical package includes an arrangement of one or more materials, components, and/or wires on a structural assembly (e.g., a baseboard) to provide one or more characteristics such as physical strength, conservation of size, and/or limitation of electrical interaction.

In one embodiment, chip set 90 includes a communication mechanism such as a bus 92 for passing information among the components of the chip set 90. A processor 94, such as an image processor has connectivity to bus 92 to execute instructions and process information stored in a memory 96. A processor may include one or more processing cores with each core configured to perform independently. Alternatively or in addition, a processor may include one or more microprocessors configured in tandem via bus 92 to enable independent execution of instructions, pipelining, and multithreading. Processor 94 may also be accompanied with one or more specialized components to perform certain processing functions and tasks such as one or more digital signal processors, e.g., DSP 98, such as an OIS DSP, image sensor, OIS gyroscope, and/or one or more application-specific integrated circuits (IC) (ASIC) 100, such as that which can be utilized to, e.g., drive a MEMS actuator for achieving OIS, zoom, and/or AF functionality. DSP 98 can typically be configured to process real-world signals (e.g., sound) in real time independently of processor 94. Similarly, ASIC 100 can be configured to performed specialized functions not easily performed by a general purposed processor. Other specialized components to aid in performing the inventive functions described herein include one or more field programmable gate arrays (FPGA) (not shown), one or more controllers (not shown), or one or more other special-purpose computer chips.

The aforementioned components have connectivity to memory 96 via bus 92. Memory 96 includes both dynamic memory (e.g., RAM) and static memory (e.g., ROM) for storing executable instructions that, when executed by processor 94, DSP 98, and/or ASIC 100, perform the process of example embodiments as described herein. Memory 96 also stores the data associated with or generated by the execution of the process.

As used herein, the term module might describe a given unit of functionality that can be performed in accordance with one or more embodiments of the present application. As used herein, a module might be implemented utilizing any form of hardware, software, or a combination thereof. For example, one or more processors, controllers, ASICs, PLAs, PALs, CPLDs, FPGAs, logical components, software routines or other mechanisms might be implemented to make up a module. In implementation, the various modules described herein might be implemented as discrete modules or the functions and features described can be shared in part or in total among one or more modules. In other words, as would be apparent to one of ordinary skill in the art after reading this description, the various features and functionality described herein may be implemented in any given application and can be implemented in one or more separate or shared modules in various combinations and permutations. Even though various features or elements of functionality may be individually described or claimed as separate modules, one of ordinary skill in the art will understand that these features and functionality can be shared among one or more common software and hardware elements, and such description shall not require or imply that separate hardware or software components are used to implement such features or functionality.

Where components or modules of the application are implemented in whole or in part using software, in one embodiment, these software elements can be implemented to operate with a computing or processing module capable of carrying out the functionality described with respect thereto. One such example computing module is shown in FIG. 10. Various embodiments are described in terms of this example-computing module 90. After reading this description, it will become apparent to a person skilled in the relevant art how to implement the application using other computing modules or architectures.

In this document, the terms "computer program medium" and "computer usable medium" are used to generally refer to transitory or non-transitory media such as, for example, memory 96, or other memory/storage units. These and other various forms of computer program media or computer usable media may be involved in carrying one or more sequences of one or more instructions to a processing device for execution. Such instructions embodied on the medium, are generally referred to as "computer program code" or a "computer program product" (which may be grouped in the form of computer programs or other groupings). When executed, such instructions might enable the computing module 90 to perform features or functions of the present application as discussed herein.

While various embodiments of the disclosed method and apparatus have been described above, it should be understood that they have been presented by way of example only, and not of limitation. Likewise, the various diagrams may depict an example architectural or other configuration for the disclosed method and apparatus, which is done to aid in understanding the features and functionality that can be included in the disclosed method and apparatus. The disclosed method and apparatus is not restricted to the illustrated example architectures or configurations, but the desired features can be implemented using a variety of alternative architectures and configurations. Indeed, it will be apparent to one of skill in the art how alternative functional, logical or physical partitioning and configurations can be implemented to implement the desired features of the disclosed method and apparatus. Also, a multitude of different constituent module names other than those depicted herein can be applied to the various partitions. Additionally, with regard to flow diagrams, operational descriptions and method claims, the order in which the steps are presented herein shall not mandate that various embodiments be implemented to perform the recited functionality in the same order unless the context dictates otherwise.

Although the disclosed method and apparatus is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations, to one or more of the other embodiments of the disclosed method and apparatus, whether or not such embodiments are described and whether or not such features are presented as being a part of a described embodiment. Thus, the breadth and scope of the claimed invention should not be limited by any of the above-described exemplary embodiments.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; the terms "a" or "an" should be read as meaning "at least one," "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future Likewise, where this document refers to technologies that would be apparent or known to one of ordinary skill in the art, such technologies encompass those apparent or known to the skilled artisan now or at any time in the future.

A group of items linked with the conjunction "and" should not be read as requiring that each and every one of those items be present in the grouping, but rather should be read as "and/or" unless expressly stated otherwise. Similarly, a group of items linked with the conjunction "or" should not be read as requiring mutual exclusivity among that group, but rather should also be read as "and/or" unless expressly stated otherwise. Furthermore, although items, elements or components of the disclosed method and apparatus may be described or claimed in the singular, the plural is contemplated to be within the scope thereof unless limitation to the singular is explicitly stated.

The presence of broadening words and phrases such as "one or more," "at least," "but not limited to" or other like phrases in some instances shall not be read to mean that the narrower case is intended or required in instances where such broadening phrases may be absent. The use of the term "module" does not imply that the components or functionality described or claimed as part of the module are all configured in a common package. Indeed, any or all of the various components of a module, whether control logic or other components, can be combined in a single package or separately maintained and can further be distributed in multiple groupings or packages or across multiple locations.

Additionally, the various embodiments set forth herein are described in terms of exemplary block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

What is claimed is:

1. A driver device, comprising:
a charge pump to generate voltage required to inject charge into an actuator;
a charge sink through which the actuator can be discharged, wherein the charging and discharging of the actuator effectuates movement of the actuator; and
a switch for operatively connecting the charge pump and the charge sink to the actuator;
wherein stability of the actuator is increased by virtue of a charge control, wherein the actuator comprises a comb drive, wherein the comb drive is maintained in a stable position via an electrostatic force as a result of the charge control, a capacitance of the comb drive having an inverse relationship to the voltage, the electrostatic force adding to an electrostatic spring force associated with the comb drive, wherein an effective stiffness of the comb drive resulting from the added electrostatic force is approximately three times greater than an actual physical stiffness of the comb drive.

2. The driver device of claim 1, wherein the driver device interfaces with a controller for controlling the movement of the actuator though one of a parallel digital interface or a serial peripheral interface.

3. The driver device of claim 2, wherein the parallel digital interface is operative to transmit pulse width modulated signals to control the injection of charge into the actuator and the discharging of the actuator.

4. The driver device of claim 1, wherein the charge pump is operatively connected to a charge capacitor for the charging of the actuator.

5. The driver device of claim 4, wherein the charge sink is operatively connected to a discharge capacitor through which the actuator is discharged.

6. The driver device of claim 1, wherein the charge pump and the charge sink are controlled by a precision current source and a precision current sink, respectively.

7. The driver device of claim 1, wherein the actuator receives a varying voltage signal injected therein to determine a capacitance of the actuator.

8. The driver device of claim 7, wherein the charging and the discharging of the actuator is performed sequentially at a frequency higher than a resonant frequency associated with the actuator to determine the capacitance of the actuator.

9. A driver device, comprising:
a driver circuit for driving a MEMS actuator via charge control to induce voltage that results in desired movement of the MEMS actuator while allowing the voltage to vary, the driver circuit, comprising:
  a charge pump configured to inject charge into the MEMS actuator;
  a charge sink configured to sink charge from the MEMS actuator; and
  a switch configured to switch at least one of the charge pump and the charge sink to an appropriate capacitive element of the MEMS actuator;
wherein stability of the MEMS actuator is increased by virtue of the charge control, wherein the MEMS actuator comprises a comb drive, wherein the comb drive is maintained in a stable position via an electrostatic force as a result of the charge control, a capacitance of the comb drive having an inverse relationship to the voltage, the electrostatic force adding to an electrostatic spring force associated with the comb drive, wherein an effective stiffness of the comb drive resulting from the added electrostatic force is approximately three times greater than an actual physical stiffness of the comb drive.

10. The driver device of claim 9, wherein an operational voltage limit of the MEMS actuator is increased by virtue of the charge control relative to a conventional voltage-controlled driver device.

11. A method, comprising:
successively charging and discharging an actuator to effectuate movement of the actuator;
determining a capacitance of the actuator to determine a position of the actuator resulting from the movement of the actuator by sensing voltage at an input of the actuator; and
measuring a slope of a voltage ramp up or ramp down resulting from the successive charging and discharging with a differentiator circuit and an analog to digital converter (ADC), the voltage ramp being a function of the capacitance of the actuator.

12. The method of claim 11, further comprising adjusting charging and discharging periods to be longer or shorter relative to each other to allow for desired movement of the actuator.

13. The method of claim 11, wherein a frequency of the charging and discharging is greater than a mechanical resonant frequency of the actuator to prevent inadvertent movement of the actuator.

14. The method of claim 11, wherein the measuring of the voltage ramp comprises measuring a ramp up in output voltage.

15. The method of claim 14, wherein the measuring of the voltage ramp further comprises measuring a peak voltage associated with the ramp up in output voltage.

16. The method of claim 11, further comprising measuring the time between a change in output voltage reflected by the voltage ramp up and ramp down with a comparator.

17. The method of claim 11, wherein the determining of the capacitance of the actuator further comprises sampling voltages induced by the successive charging and discharging of the actuator.

18. The method of claim 11, wherein the determining of the capacitance of the actuator comprises generating a varying voltage resulting in the voltage at an input of the actuator and sensing coupling via a capacitor.

* * * * *